US012811096B2

(12) United States Patent
Kim et al.

(10) Patent No.: US 12,811,096 B2
(45) Date of Patent: Nov. 24, 2026

(54) DEVICE AND METHOD FOR GENERATING HIGH VOLTAGE MODULATED NON-SINUSOIDAL WAVE IN SEMICONDUCTOR MANUFACTURING FACILITY USING PLASMA

(71) Applicant: DAWON POWERTRON CO., LTD., Ansan-si (KR)

(72) Inventors: Young Woo Kim, Ansan-si (KR); Eun Sang Ahn, Ansan-si (KR)

(73) Assignee: Dawon Powertron Co., Ltd., Ansan-si (KR)

( * ) Notice: Subject to any disclaimer, the term of this patent is extended or adjusted under 35 U.S.C. 154(b) by 21 days.

(21) Appl. No.: 19/236,441

(22) Filed: Jun. 12, 2025

(65) Prior Publication Data

US 2025/0308846 A1 Oct. 2, 2025

Related U.S. Application Data

(63) Continuation of application No. PCT/KR2023/020552, filed on Dec. 13, 2023.

(30) Foreign Application Priority Data

Dec. 13, 2022 (KR) ........................ 10-2022-0174215

(51) Int. Cl.
*H01J 37/32* (2006.01)

(52) U.S. Cl.
CPC .. *H01J 37/32128* (2013.01); *H01J 37/32155* (2013.01); *H01J 37/32174* (2013.01); *H01J 2237/3343* (2013.01)

(58) Field of Classification Search
CPC ........... H01J 37/32128; H01J 37/32155; H01J 37/32174; H01J 2237/3343; H01J 37/32; H01J 37/32146; H03K 3/57; H03K 4/26
See application file for complete search history.

(56) References Cited

U.S. PATENT DOCUMENTS 10,388,544 B2 8/2019 Ui et al.
10,410,833 B2 9/2019 Legein et al.
(Continued)

FOREIGN PATENT DOCUMENTS

KR 10-2014-0060502 A 5/2014
KR 10-2015-0123209 A 11/2015
(Continued)

OTHER PUBLICATIONS

International Search Report (English and Korean) and Written Opinion of the ISA (Korean) issued in PCT/KR2023/020552, mailed Apr. 8, 2024; ISA/KR.

*Primary Examiner* — Minh Tran
(74) *Attorney, Agent, or Firm* — Harness, Dickey & Pierce, P.L.C.

(57) ABSTRACT

The present embodiment provides a non-sinusoidal signal generation device comprising: a first rectangular wave circuit configured to be able to apply positive voltages of two different magnitudes to an output terminal; a second rectangular wave circuit configured to be able to apply one negative voltage to the output terminal; and a sawtooth wave circuit configured to be able to apply one sawtooth voltage to the output terminal, wherein the sawtooth wave circuit includes an inductor configured to draw current from a capacitive load connected to the output terminal.

9 Claims, 21 Drawing Sheets

(56) References Cited

U.S. PATENT DOCUMENTS

| | | | | |
|---|---|---|---|---|
| 10,474,184 | B2 * | 11/2019 | Kim | H03K 3/64 |
| 10,516,388 | B1 * | 12/2019 | Kim | H03K 3/64 |
| 10,998,169 | B2 | 5/2021 | Ventzek et al. | |
| 2022/0285131 | A1 | 9/2022 | Shaw et al. | |

FOREIGN PATENT DOCUMENTS

| | | | |
|---|---|---|---|
| KR | 10-2016-0068871 | A | 6/2016 |
| KR | 10-2021-0060455 | A | 5/2021 |
| KR | 10-2022-0158660 | A | 12/2022 |

* cited by examiner

DEVICE AND METHOD FOR GENERATING HIGH VOLTAGE MODULATED NON-SINUSOIDAL WAVE IN SEMICONDUCTOR MANUFACTURING FACILITY USING PLASMA

CROSS-REFERENCE TO RELATED APPLICATION

The present application is a continuation of International Application No. PCT/KR2023/020552, filed on Dec. 13, 2023, which is based upon and claims priority to Korean Patent Application No. 10-2022-0174215, filed on Dec. 13, 2022 in Korea. The entire disclosure of the above application is incorporated herein by reference.

TECHNICAL FIELD

The present embodiment relates to a device and a method for generating a high voltage modulated non-sinusoidal wave in a semiconductor manufacturing facility using plasma.

BACKGROUND

The description below merely provides background information related to the present embodiment and does not constitute the prior art.

Existing voltage generators are generally configured to generate a monotonous level of output voltages at an output terminal, making it difficult to apply the existing voltage generators to environments where it is required to generate various levels of output voltages.

In addition, even when the voltage generators are implemented to generate various levels of voltages, a circuit configuration where circuitry is not complicated is required.

Thus, a method is required for improving the performance of equipment equipped with the voltage generators, in an economic and precise manner, by precisely controlling various levels of output voltages output from the voltage generators, such as a low voltage level and a high voltage level.

SUMMARY

An aspect of the present invention is to provide a device and a method for generating a high-voltage modulated non-sinusoidal wave in a semiconductor manufacturing facility using plasma.

According to the present embodiment, there is provided a non-sinusoidal signal generation device including: a first rectangular wave circuit configured to be able to apply positive voltages of two different magnitudes to an output terminal; a second rectangular wave circuit configured to be able to apply one negative voltage to the output terminal; and a sawtooth wave circuit configured to be able to apply one sawtooth voltage to the output terminal, wherein the sawtooth wave circuit includes an inductor configured to draw current from a capacitive load connected to the output terminal.

According to the present embodiment, there is provided a method for generating a non-sinusoidal signal by a device including a first rectangular wave circuit, a second rectangular wave circuit, and a sawtooth wave circuit, the method including steps of: applying a first positive voltage to an output terminal by the first rectangular wave circuit; applying a negative voltage to the output terminal by the second rectangular wave circuit; applying a first sawtooth voltage to the output terminal by the sawtooth wave circuit; and applying a second positive voltage to the output terminal by the first rectangular wave circuit, wherein, in the step of applying the first sawtooth voltage, current is drawn from a capacitive load connected to the output terminal by using an inductor included in the sawtooth wave circuit.

According to the present embodiment, there is provided an apparatus for manufacturing a semiconductor device including a non-sinusoidal signal generation device and a chamber, wherein the non-sinusoidal signal generation device includes: a first rectangular wave circuit configured to be able to apply positive voltages of two different magnitudes to an output terminal; a second rectangular wave circuit configured to be able to apply negative voltages of two different magnitudes to the output terminal; and a sawtooth wave circuit configured to be able to apply sawtooth voltages of two different magnitudes to the output terminal, wherein the sawtooth wave circuit includes an inductor configured to draw current from a capacitive load connected to the output terminal.

The present invention has an effect of providing a non-sinusoidal signal generation device and an apparatus for manufacturing a semiconductor device capable of generating various outputs by selectively generating high voltage rectangular wave and sawtooth voltage signals and relatively low voltage rectangular wave signals through switching to a multilevel input voltage circuit.

GLOSSARY

Figure 1:
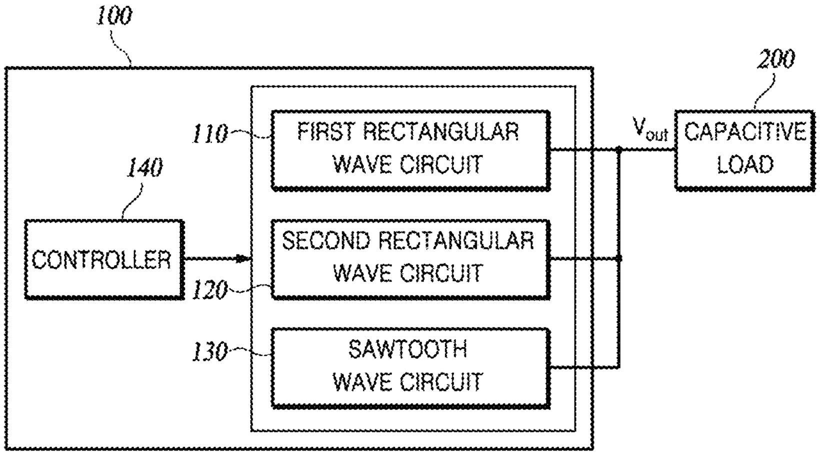
FIG. 1 is a schematic block diagram of a non-sinusoidal signal generation device and a capacitive load, according to the present embodiment.

100, 700: non-sinusoidal signal generation device
110, 710: first rectangular wave circuit
120, 720: second rectangular wave circuit
130, 730: sawtooth wave circuit
140: controller 200: capacitive load

DETAILED DESCRIPTION

Hereinafter, some embodiments of the present invention are described in detail with reference to the drawings. It should be noted that, when assigning identification symbols to the components in each drawing, the same components have the same symbols as much as possible even if they are indicated in different drawings. In addition, when it is determined herein that the specific description of related known components or functions can obscure the gist of the present invention, the detailed description thereof will be omitted.

FIG. 1 is a schematic block diagram of a non-sinusoidal signal generation device 100 and a capacitive load 200, according to the present embodiment.

The non-sinusoidal signal generation device 100 may generate an output voltage Vout having a certain waveform set by a user, and the generated output voltage Vout may be provided to the capacitive load 200. For example, the capacitive load 200 includes a chamber CB as a semiconductor manufacturing facility using plasma.

The output waveform of the non-sinusoidal signal generation device 100 may have a frequency of several kHz to several MHz and may be output at any variable voltage level of several tens of V to several tens of kV.

The non-sinusoidal signal generation device 100 may include a first rectangular wave circuit 110, a second rectangular wave circuit 120, at least one sawtooth wave circuit 130, and a controller 140.

Figure 2:
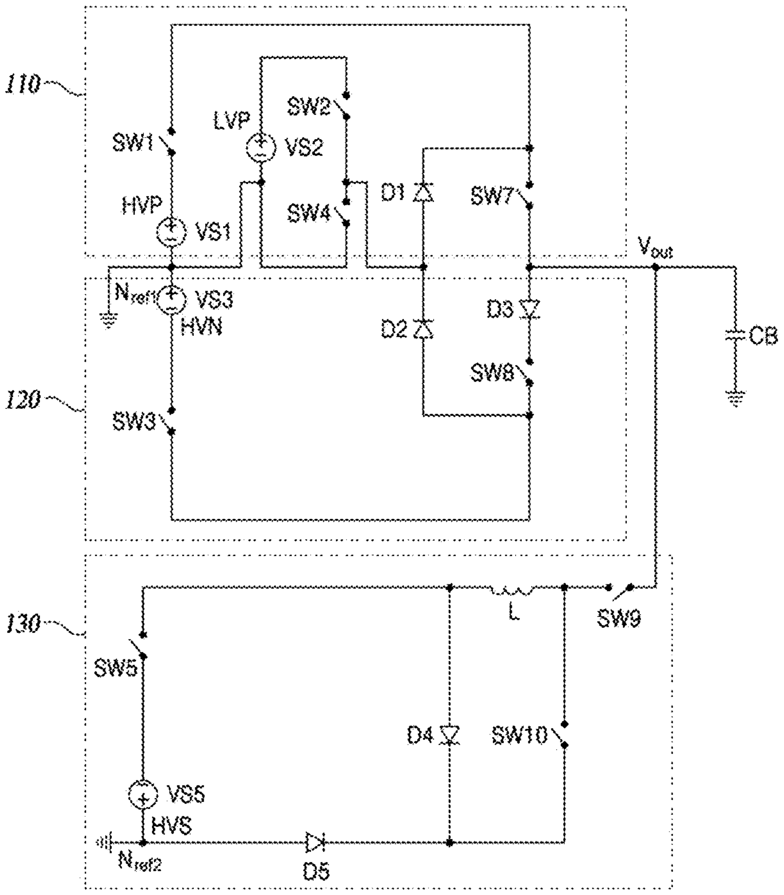
FIG. 2 is a circuit diagram of the non-sinusoidal signal generation device according to a first embodiment.

FIG. 2 is a circuit diagram of the non-sinusoidal signal generation device 100 according to a first embodiment.

In FIG. 2, the controller 140 is omitted from among the components of the non-sinusoidal signal generation device 100.

The first rectangular wave circuit 110 is configured to be able to apply positive voltages of two different magnitudes to an output terminal.

The second rectangular wave circuit 120 is configured to be able to apply one negative voltage to the output terminal.

The sawtooth wave circuit 130 is configured to be able to apply one sawtooth voltage to the output terminal and includes an inductor configured to draw current from a capacitive load connected to the output terminal (i.e., to discharge the capacitive load).

Referring to FIG. 2, the first rectangular wave circuit 110, the second rectangular wave circuit 120, and the sawtooth wave circuit 130 may be connected in parallel between an output terminal Nout that outputs the output voltage Vout and a ground GND that provides a reference potential. A chamber CB may be further connected to the output terminal Nout, where the chamber CB may be modeled as a capacitive load, e.g., a capacitor.

The first rectangular wave circuit 110 may include a first voltage source VS1, a second voltage source VS2, a first switch SW1, a second switch SW2, a fourth switch SW4, a seventh switch SW7, and a first diode D1.

The second rectangular wave circuit 120 may include a third voltage source VS3, a third switch SW3, an eighth switch SW8, a second diode D2, and a third diode D3.

A circuit where the first voltage source VS1 and the first switch SW1 are connected in series is referred to as a first voltage source circuit, a circuit where the second voltage source VS2 and the second switch SW2 are connected in series is referred to as a second voltage source circuit, and a circuit where the third voltage source VS3 and the third switch SW3 are connected in series is referred to as third voltage source circuit.

The first and second voltage source circuits may be connected to a first reference terminal Nref1. The first reference terminal Nref1 may be connected to the ground GND to provide a reference potential (e.g., 0 potential) to the non-sinusoidal signal generation device 100.

In the first rectangular wave circuit 110, a negative terminal of the first voltage source circuit and a negative terminal of the second voltage source circuit are each connected to the first reference terminal Nref1, and a positive terminal of the first voltage source circuit and a positive terminal of the second voltage source circuit are each connected to one end of the seventh switch SW7, wherein the other end of the seventh switch SW7 is connected to the output terminal Nout.

In addition, the fourth switch SW4 is connected in parallel with the second voltage source circuit.

The negative terminal of the first voltage source circuit refers to a terminal of the first voltage source circuit in a negative terminal direction of the first voltage source VS1, the positive terminal of the first voltage source circuit refers to a terminal of the first voltage source circuit in a positive terminal direction of the first voltage source VS1, the negative terminal of the second voltage source circuit refers to a terminal of the second voltage source circuit in a negative terminal direction of the second voltage source VS2, and the positive terminal of the second voltage source circuit refers to a terminal of the second voltage source circuit in a positive terminal direction of the second voltage source VS2.

The first and second voltage sources VS1 and VS2 may output first and second voltages V1 and V2, respectively, having different magnitudes. The first and second voltage sources VS1 and VS2 may be DC voltage sources, but may have variable values. In addition, a magnitude of the first voltage V1 may be greater than or less than that of the second voltage V2.

In the second rectangular wave circuit 120, the positive terminal of the third voltage source circuit is connected to the first reference terminal Nref1, and the negative terminal of the third voltage source circuit is connected to one end of the eighth switch SW8. The eighth switch SW8 is connected between the negative terminal of the third voltage source circuit and the output terminal Nout.

The negative terminal of the third voltage source circuit refers to a terminal of the third voltage source circuit in a negative terminal direction of the third voltage source VS3 and the positive terminal of the third voltage source circuit refers to a terminal of the third voltage source circuit in a positive terminal direction of the third voltage source VS3.

The first diode D1 may be connected between the positive terminal of the second voltage source circuit and one end of the seventh switch SW7. An anode of the first diode D1 may be connected to the positive terminal of the second voltage source circuit, and a cathode of the first diode D1 may be connected to one end of the seventh switch SW7.

The second diode D2 may be connected between the positive terminal of the second voltage source circuit and the negative terminal of the third voltage source circuit. A cathode of the second diode D2 may be connected to the positive terminal of the second voltage source circuit, and an anode of the second diode D2 may be connected to the negative terminal of the third voltage source circuit.

The third diode D3 may be connected between the output terminal Nout and the other end of the eighth switch SW8. An anode of the third diode D3 may be connected to the output terminal Nout, and a cathode of the third diode D3 may be connected to the other end of the eighth switch SW8.

When the seventh switch SW7 is turned on and the eighth switch SW8 is turned off, the first voltage V1 or the second voltage V2 having different magnitudes may be output to the output terminal Nout. In this state, when the first switch SW1 is turned on and the second and fourth switches SW2 and SW4 are turned off, the positive first voltage V1 may be output to the output terminal Nout, and when the first and fourth switches SW1 and SW4 are turn off and the second switch SW2 is turned on, the positive second voltage V2 may be output to the output terminal Nout.

When the seventh switch SW7 is turned off and the third and eighth switches SW3 and SW8 are turned on, the third voltage V3 having a negative magnitude may be output to the output terminal Nout.

In addition, when the second, third, and seventh switches SW2, SW3, and SW7 are turned off and the fourth and eighth switches SW4 and SW8 are turned on, a ground GND voltage or a zero voltage may be output to the output terminal Nout.

Accordingly, four different levels of voltages 0, V1, V2, and V3 may be output to the output terminal Nout.

The sawtooth wave circuit 130 may include a fifth voltage source VS5, a fifth switch SW5, a ninth switch SW9, a tenth switch SW10, a fourth diode D4, a fifth diode D5, and an inductor L.

A circuit where the fifth voltage source VS5 and the fifth switch SW5 are connected in series is referred to as a fifth voltage source circuit.

In the sawtooth wave circuit 130, a positive terminal of the fifth voltage source circuit generating a negative voltage is connected to a second reference terminal Nref2, and an anode of the fourth diode D4 and one end of the inductor L are connected in parallel to a negative terminal of the fifth voltage source circuit.

The tenth switch SW10 is connected between the other end of the inductor L and a cathode of the fourth diode D4, and the fifth diode D5 is connected between the second reference terminal Nref2 and the cathode of the fourth diode D4. An anode of the fifth diode D5 is connected to the second reference terminal Nref2, and a cathode of the fifth diode D5 is connected to the cathode of the fourth diode D4. The second reference terminal Nref2 may be connected to the ground GND that provides a reference potential.

For reference, when the first reference terminal Nef1 and the second reference terminal Nef2 are each connected to the ground GND, the ground GND may be expressed as a reference terminal.

The ninth switch SW9 is connected between the other end of the inductor L and the output terminal Nout.

The negative terminal of the fifth voltage source circuit refers to a terminal of the fifth voltage source circuit in a negative terminal direction of the fifth voltage source VS5, and the positive terminal of the fifth voltage source circuit refers to a terminal of the fifth voltage source circuit in a positive terminal direction of the fifth voltage source VS5.

The sawtooth wave circuit 130 may generate a sawtooth voltage (i.e., a slope voltage) by charging the current of the inductor L using the fifth voltage source VS5 and then drawing the current from the chamber CB to change the voltage of the chamber CB, as described below.

The inductor L may have an inductance determined according to values of the first, third, and fifth voltages V1, V3, and V5.

The first to tenth switches SW1, SW2, SW3, SW4, SW5, SW7, SW8, SW9, and SW10 may be power semiconductor devices. The power semiconductor device, which is a semiconductor device used for power conversion or control, may be implemented as an device, such as an insulated gate bipolar transistor (IGBT) or a metal-oxide semiconductor field effect transistor (MOSFET).

In addition, the controller 140 generates drive signals for turning the first to tenth switches SW1, SW2, SW3, SW4, SW5, SW7, SW8, SW9, and SW10 on or off.

Figure 3A:
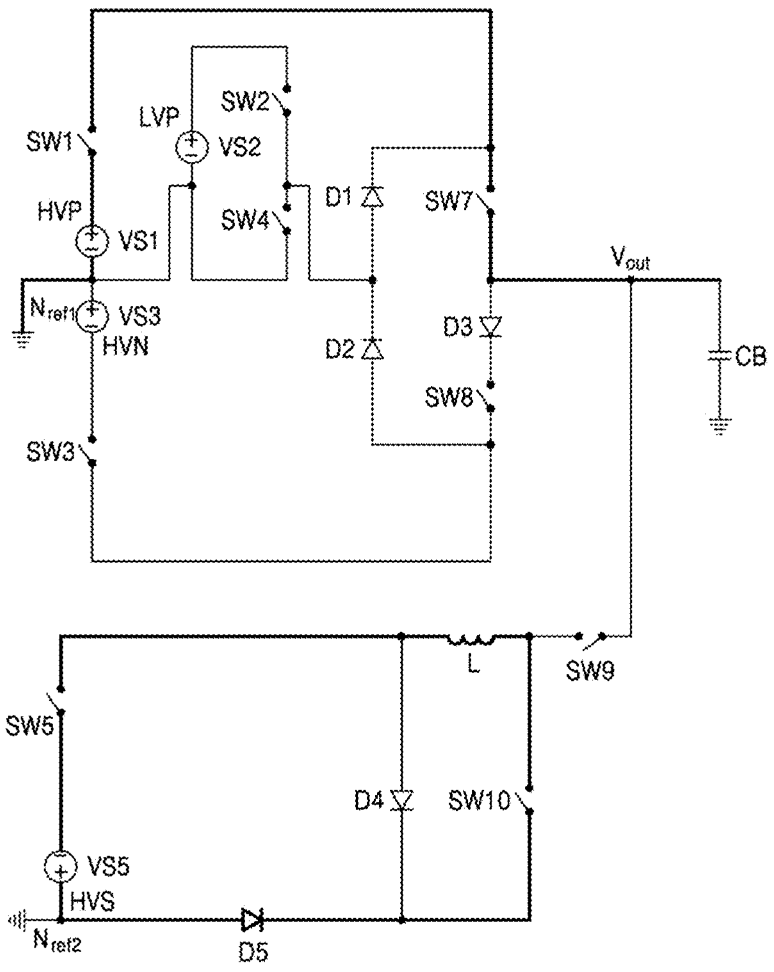
FIGS. 3A to 3E are circuit diagrams illustrating an operation of the non-sinusoidal signal generation device according to the first embodiment.
Figure 3B:
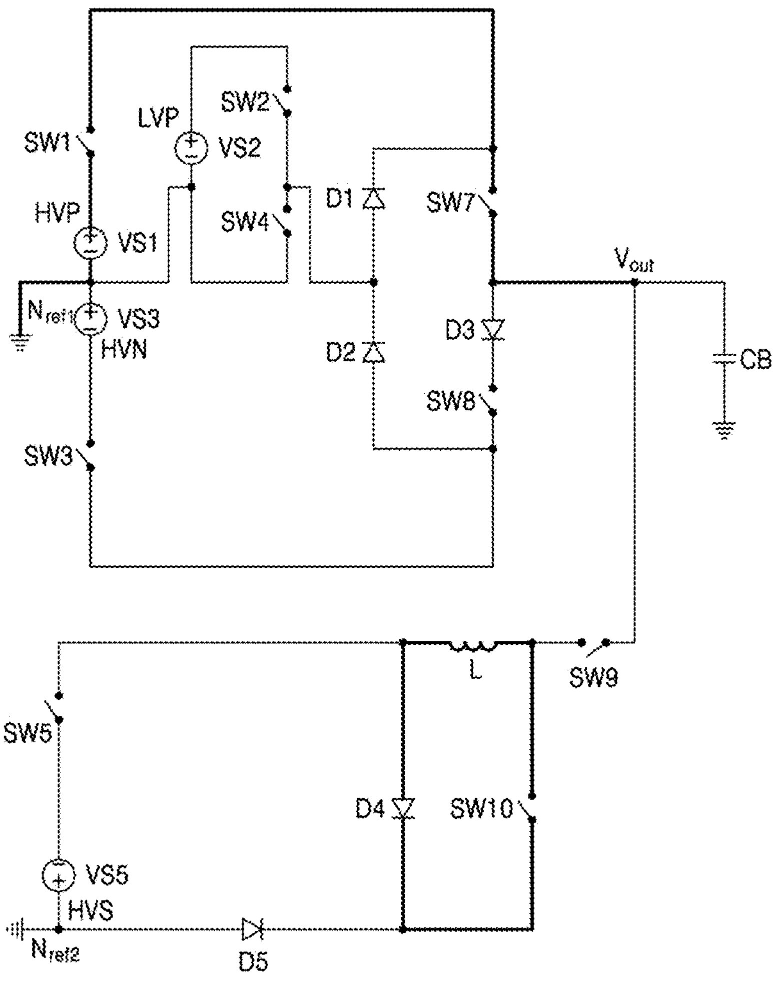
Figure 3C:
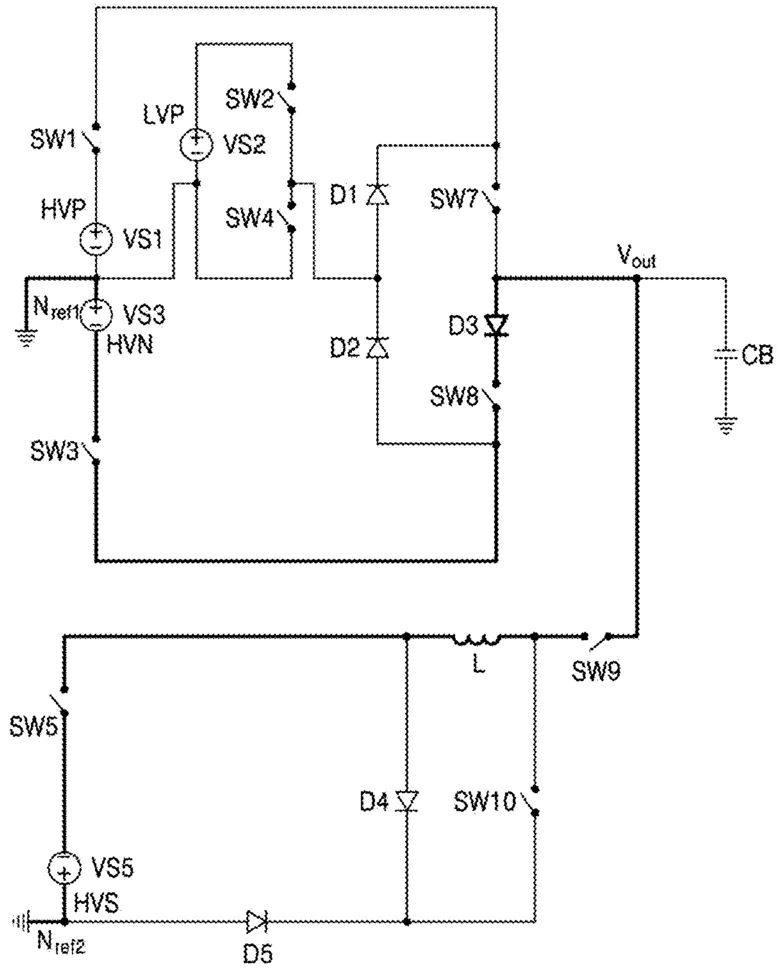
Figure 3D:
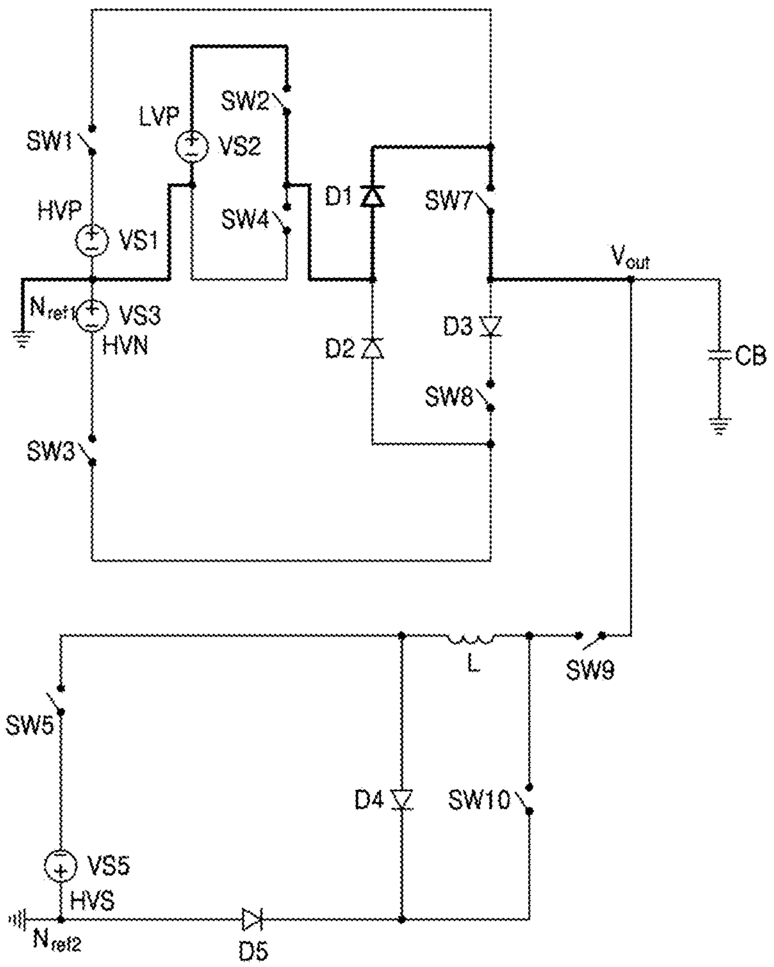
Figure 3E:
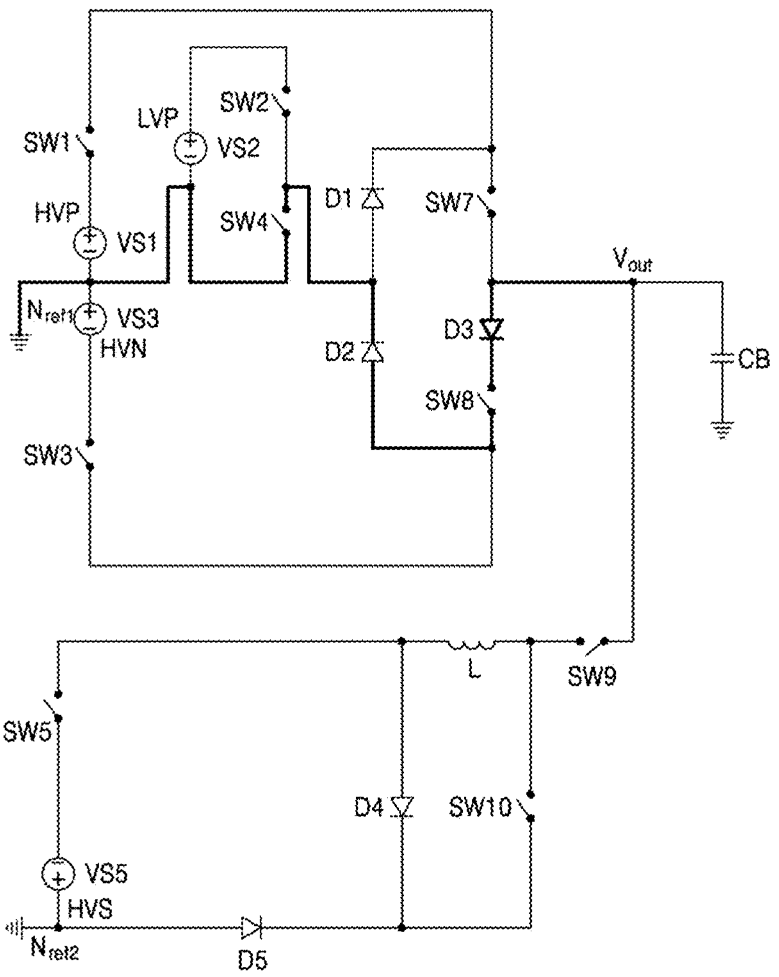
Figure 4:
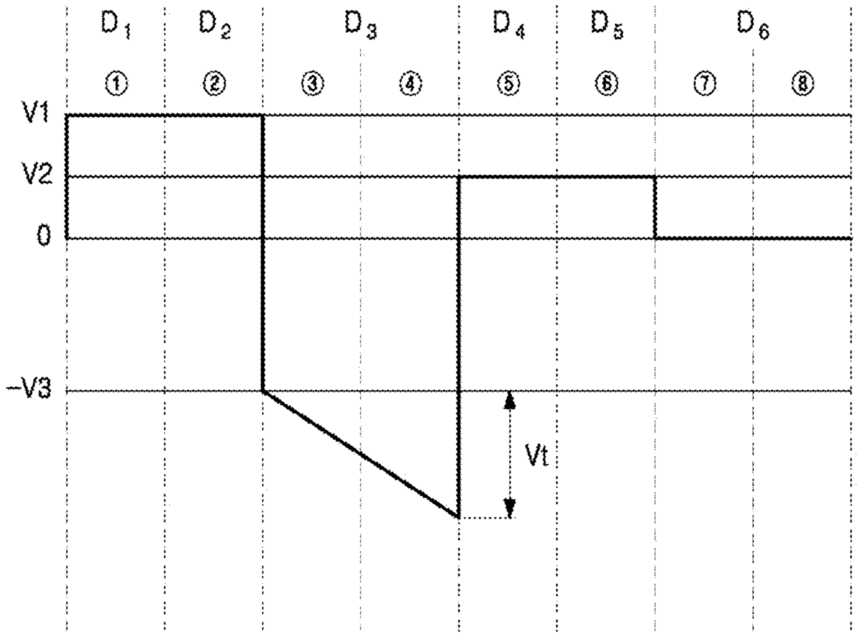
FIG. 4 is a diagram illustrating a waveform of output Vout of an output terminal Nout in switching sections D1, D2, D3, D4, D5, D6, corresponding to the respective circuits of FIGS. 3A to 3F.

FIGS. 3A to 3E are circuit diagrams illustrating an operation of the non-sinusoidal signal generation device 100 according to the first embodiment, and FIG. 4 is a diagram illustrating a waveform of the outputs Vout of the output terminal Nout in the switching sections D1, D2, D3, D4, D5, and D6 corresponding to the respective circuits in FIGS. 3A and 3E.

Referring to FIGS. 3A to 3E and FIG. 4, FIGS. 3A to 3E are diagrams illustrating switching states of a circuit with respect to a section D1, a section D2, a section D3, sections D4 to D5, and a section D6, respectively.

In FIG. 3A, as the first switch SW1, the seventh switch SW7, the fifth switch SW5, and the tenth switch SW10 are in an on state and all the other switches are in an off state, a circuit illustrated by a thick line in FIG. 3A is formed.

In FIG. 3A, the positive terminal of the first voltage source VS1 may be connected to the output terminal Nout via the first and seventh switches SW1 and SW7. Accordingly, the first voltage V1 may be applied as the output voltage Vout.

In addition, as a path including the fifth voltage source VS5, the fifth diode D5, the tenth switch SW10, the inductor L, and the fifth switch SW5 is formed, the inductor L may be charged by the fifth voltage source VS5. At this time, as a closed path passing through the second voltage source VS2 and the third voltage source VS3 is not formed, the second voltage source VS2 and the third voltage source VS3 may be floated.

In FIG. 3B, as the first switch SW1, the seventh switch SW7, and the tenth switch SW10 are in an on state and all the other switches are in an off state, a circuit illustrated by a thick line in FIG. 3B is formed.

In FIG. 3B, the positive terminal of the first voltage source VS1 may be connected to the output terminal Nout via the first and seventh switches SW1 and SW7. Accordingly, the first voltage V1 may be applied as the output voltage Vout. In addition, as a closed path composed of the inductor L, the fourth diode D4, and the tenth switch SW10 is formed, the current of the inductor L may flow continuously. At this time, as a closed path passing through the second voltage source VS2, the third voltage source VS3, and the fifth voltage source VS5 is not formed, the second voltage source VS2, the third voltage source VS3, and the fifth voltage source VS5 may be floated.

In FIG. 3C, as the third switch SW3, the eighth switch SW8, the fifth switch SW5, and the ninth switch SW9 are in an on state and all the other switches are in an off state, a circuit illustrated by a thick line in FIG. 3C is formed.

In FIG. 3C, a negative terminal of the third voltage source VS3 may be connected to the output terminal Nout via the third and eighth switches SW3 and SW8. Accordingly, the third voltage V3 may be applied as the output voltage Vout. In addition, a negative terminal of the fifth voltage source VS5 is connected to the output terminal Nout via the fifth switch SW5, the inductor L, and the ninth switch SW9. Therefore, the fifth voltage V5 having a negative magnitude and the voltage by the current of the inductor L may be applied to the output terminal Nout. At this time, as a closed path passing through the first voltage source VS1 and the second voltage source VS2 is not formed, the first voltage source VS1 and the second voltage source VS2 may be floated.

In FIG. 3C, a current substantially equal to the current of the inductor L may flow into the sawtooth wave circuit 130 from the chamber CB modeled as a capacitive load to generate a sawtooth wave. At this time, a voltage change according to Equation 1 below may occur in the chamber CB.

$$C_{CB}\frac{dV_{out}}{dt} = I_s \quad \text{[Equation 1]}$$

The $C_{CB}$ is an equivalent capacitance of the chamber CB, and may correspond to a current flowing from the chamber CB to the inductor L.

Accordingly, since the voltage applied to the chamber CB is lower than the voltage provided by the third voltage source VS3 (i.e., has a negative voltage with a greater absolute value), a sawtooth wave shape (slope) may be formed in the output voltage. At this time, the current may not substantially flow from the second rectangular wave circuit 120 to the chamber CB due to the operation of the third diode D3. Specifically, since the voltage of the cathode of the third diode D3 becomes lower than the voltage of the anode thereof due to the decrease in the output voltage, the current may not flow from the second rectangular wave circuit 120 to the chamber CB. Accordingly, the current may flow only from the chamber CB to the sawtooth wave circuit 130.

Figure 5A:
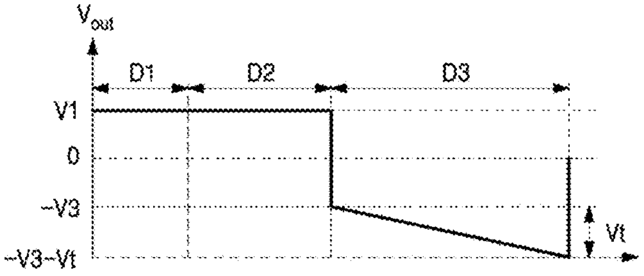
FIGS. 5A to 5C are diagrams illustrating an operation method of the non-sinusoidal signal generation device according to the first embodiment.
Figure 5B:
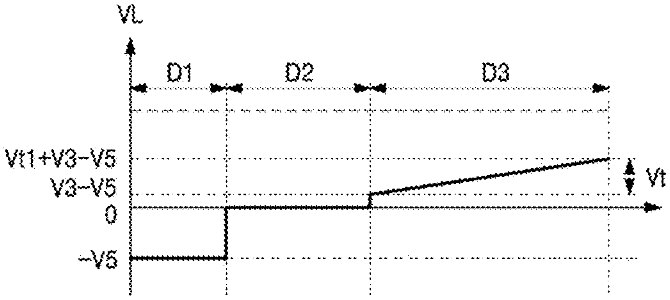
Figure 5C:
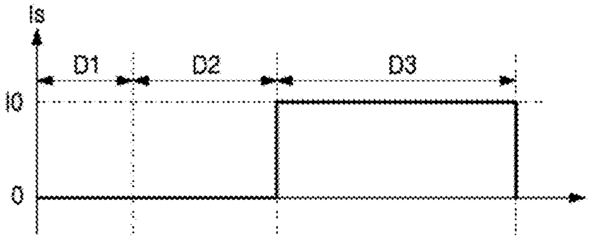

FIGS. 5A to 5C are diagrams illustrating an operation method of the non-sinusoidal signal generation device 100 according to the first embodiment.

FIG. 5A is a graph illustrating the output voltage Vout of the output terminal Nout corresponding to respective sections of FIGS. 3A to 3C over time. FIG. 5B is a graph illustrating the voltage VL at both ends of the inductor L corresponding to respective sections of FIGS. 3A to 3C over time. FIG. 5C is a graph illustrating the current flowing from the chamber CB to the sawtooth wave circuit 130, corresponding to respective sections of FIGS. 3A to 3C, over time.

Referring to FIGS. 3A to 3C and 5A, as the first voltage source VS1 is connected to the output terminal Nout via the first and seventh switches SW1 and SW7 during the first and second sections D1 and D2, the output voltage Vout may be substantially the same as the first voltage V1.

According to Equation 1, the output voltage Vout is changed by the current flowing out from the chamber CB, which is a capacitive load, during the third section D3. The magnitude of the change in the output voltage Vout during the third section D3, i.e., the difference between a maximum value and a minimum value of the output voltage Vout during the third section D3, is designated as. The output voltage Vout is shown to change to a negative value having a greater absolute value, but is not limited thereto.

Referring to FIGS. 3A to 3C and 5B, since the inductor L is charged by the fifth voltage source VS5 during the first section D1, a voltage of the fifth voltage source VS5 is applied between both ends of the inductor L and no voltage is applied during the second section D2. During the third section D3, a voltage corresponding to a voltage difference between the output voltage Vout and the fifth voltage V5 may be applied between both ends of the inductor L.

When the circuit starts to operate and reaches a normal state after a sufficient period of time has elapsed, the current of the inductor L may be periodic, and as shown in Equation 2, the result of one periodic integration of the voltage at both ends of the inductor L may be 0.

$$\int_0^{D1+D2+D3} VL\,dt = -V5\cdot D1 = 0\cdot D2 + \left(-(-V3) - V5 + \frac{1}{2}Vt\right)\cdot D3 \quad \text{[Equation 2]}$$

The description with respect to is as shown in Equation 3 below.

$$Vt = 2\left(1 + \frac{D1}{D3}\right)V5 - 2V3 \quad \text{[Equation 3]}$$

Therefore, the magnitude of may be controlled by adjusting the length of the first section D1 and the magnitudes of the third and fifth voltages V3 and V5. When the sum of the lengths of the first to third sections D1, D2, and D3 is constant, a ratio of the length of the first section D1 to the length of the third section D3 may be changed by the length of the second section D2, thereby generating a sawtooth voltage having various slopes. For example, when the length of the sum D1+D2 of the first and second sections D1 and D2 is kept constant and the length of the first section D1 is increased while the length of the second section D2 is decreased, the slope of the sawtooth voltage may be increased. Conversely, when the length of the sum D1+D2 of the first and second sections D1 and D2 is kept constant and the length of the first section D1 is decreased while the length of the second section D2 is increased, the slope of the sawtooth voltage may be decreased.

Referring to FIGS. 3A to 3C and 5C, since an electrical path from the chamber CB to the sawtooth wave circuit 130 is not formed during the first to second sections D1 and D2, no current may flow. As an electrical path passing through the fifth voltage source VS5, the fifth switch SW5, the eleventh switch SW11, the inductor L, the thirteenth switch SW13, and the chamber CB is formed during the third section D3, the current may flow from the chamber CB to the sawtooth wave circuit 130. At this time, by determining the inductance of the inductor L in consideration of the values of the first, third, and fifth voltages V1, V3, and V5 and the lengths of the first to third sections D1, D2, and D3, the value of the current flowing from the chamber CB to the sawtooth wave circuit 130 during the third section D3 may be maintained at a substantially constant current value I0. However, the present invention is not limited thereto. The value of the current flowing from the chamber CB to the sawtooth wave circuit 130 during the third section D3 may vary.

Figure 6A:
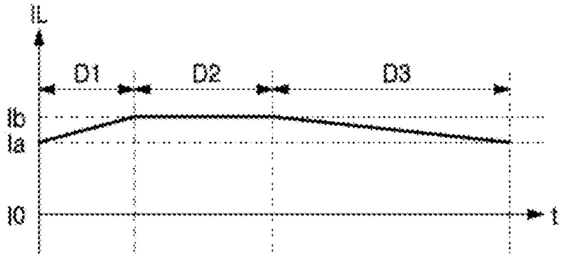
FIGS. 6A to 6C are diagrams illustrating a method of determining an inductance of an inductor included in the non-sinusoidal signal generation device according to the first embodiment.
Figure 6B:
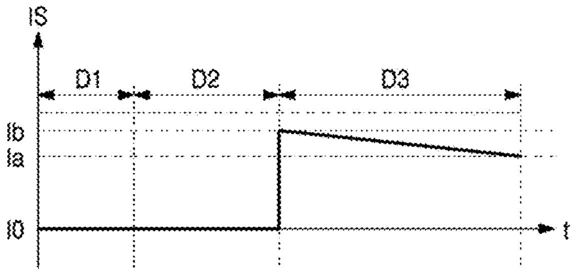
Figure 6C:
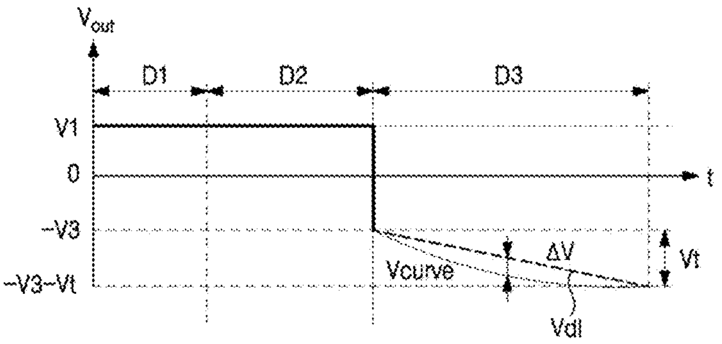

FIGS. 6A to 6C are diagrams illustrating a method of determining the inductance of the inductor L included in the non-sinusoidal signal generation device 100, according to the first embodiment.

FIG. 6A is a diagram illustrating an inductor current over time for each of the first to third sections D1, D2, and D3 in FIGS. 3A to 3C. Unlike that shown in FIG. 6A, the substantial inductor current may be increased by applying the first voltage V1 during the first section D1, may be maintained at a constant value during the second section D2, and may be decreased during the third section D3.

When a sufficient time elapses after the controller 140 starts to drive the first to thirteenth switches SW1 to SW13, the inductor current may reach a normal state and the amount of increase in the inductor current during the first section D1 may be substantially the same as the amount of decrease therein during the third section D3. Assuming that the value of the inductor current at the start of the first section D1 is and the value of the inductor current at the end of the first section D1 is, and satisfy Equation 4 with respect to the fifth voltage V5.

$$Ib - Ia = \frac{V5 \cdot D1}{La} \quad \text{[Equation 4]}$$

is the inductance of the inductor L.

Referring to FIGS. 6A and 6B, when it is assumed that, during the third section D3, the inductor current and the chamber current are the same and the inductor current changes linearly, it may be expressed as Equation 5 below.

$$Is = IL = Ib + (Ia + Ib)\left(\frac{t - D1 - D2}{D3}\right) \quad \text{[Equation 5]}$$

refers to time.

Referring to FIG. 6C, the output voltage Vout during the third section D3 changed by the current in Equation 5 may be curved, unlike the output voltage Vout of the third section D3 in FIG. 5A, which is referred to as a curved voltage Vcurve.

The curved voltage Vcurve according to Equation 5 is a second-order polynomial with respect to time, and the linear voltage Vdl and the curved voltage Vcurve have the same value at the start point and the end point of the third section D3. It may be seen that when the first-order equation and the second-order equation meet at two points through the differential operation, the maximum value of the difference appears at the midpoint of the two points. Accordingly, assuming that the maximum value of the difference between the linear voltage Vdl and the curved voltage Vcurve is ΔV, ΔV satisfies Equation 6 below.

$$C_{CB} \cdot \Delta V = (Ib - Ia) \cdot \frac{D3}{8} = \frac{V3 \cdot D1}{La} \cdot \frac{D3}{8} \quad \text{[Equation 6]}$$

The description with respect to the inductance is as shown in Equation 7 below.

$$La = \frac{D1 \cdot D3}{8C_{CB}} \cdot \frac{V3}{\Delta V} \quad \text{[Equation 7]}$$

Accordingly, as the value of the inductance increases, the output voltage Vout during the third section D3 may change to a shape close to a straight line. When the maximum value or the upper limit of the deviation from the actual output curved voltage Vcurve and the linear voltage Vdl is determined, the inductance value may be determined accordingly.

In FIG. 3D, as the second switch SW2 and the seventh switch SW7 are in an on state and all the other switches are in an off state, a circuit illustrated by a thick line in FIG. 3D is formed.

In FIG. 3D, the positive terminal of the second voltage source VS2 may be connected to the output terminal Nout via the second and seventh switches SW2 and SW7. Accordingly, the second voltage V2 may be applied as the output voltage Vout. At this time, as a closed path passing through the first voltage source VS1, the third voltage source VS3, and the fifth voltage source VS5 is not formed, the first voltage source VS1, the third voltage source VS3, and the fifth voltage source VS5 may be floated.

In FIG. 3E, as the fourth switch SW4 and the seventh switch SW7 are in an on state and all the other switches are in an off state, a circuit illustrated by a thick line in FIG. 3E is formed. Accordingly, a reference potential (e.g., 0 potential) may be applied as the output voltage Vout. At this time, as a closed path passing through the first voltage source VS1, the second voltage source VS2, the third voltage source VS3, and the fifth voltage source VS5 is not formed, the first voltage source VS1, the second voltage source VS2, the third voltage source VS3, and the fifth voltage sources VS5 may be floated.

Figure 7:
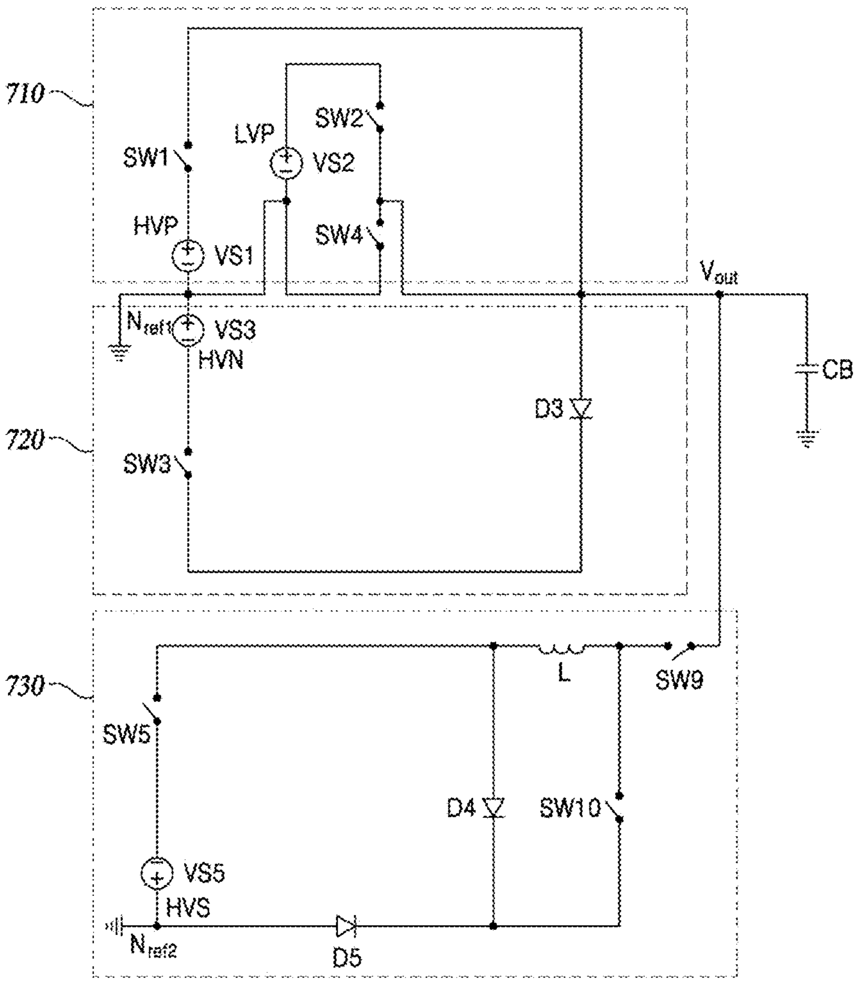
FIG. 7 is a circuit diagram of a non-sinusoidal signal generation device according to a second embodiment, excluding a controller.

FIG. 7 is a circuit diagram of a non-sinusoidal signal generation device 700 according to a second embodiment, excluding a controller (not shown). In FIG. 7, the controller (not shown) controls each switch by generating a drive signal to turn each switch on or off.

The non-sinusoidal signal generation device 700 includes a first rectangular wave circuit 710, a second rectangular wave circuit 720, and a sawtooth wave circuit 730.

The first rectangular wave circuit 710 may include a first voltage source VS1, a second voltage source VS2, a first switch SW1, a second switch SW2, and a fourth switch SW4.

The second rectangular wave circuit 120 may include a third voltage source VS3, a third switch SW3, and a third diode D3.

Referring to FIGS. 2 and 7, in the non-sinusoidal signal generation device 700 according to the second embodiment, the seventh and eighth switches SW7 and SW8, the first diode D1, and the second diode D2 are omitted, and the other components are connected in the same form as those in the non-sinusoidal signal generating device 100 according to the first embodiment.

In the non-sinusoidal signal generation device 700 according to the second embodiment, a positive terminal of the first voltage source circuit including the first voltage source VS1 and the first switch SW1, a positive terminal of the second voltage source circuit including the second voltage source VS2 and the second switch SW2, and a negative terminal of the third voltage source circuit including the third voltage source VS3 and the third switch SW3 are connected in parallel to the output terminal Nout.

Both ends of the fourth switch SW4 are respectively connected to both ends of the second voltage source circuit, an anode of the third diode D3 is connected to the output terminal Nout, and a cathode of the third diode D3 is connected to the negative terminal of the third voltage source circuit.

The output waveforms for operation modes D1 to D6 in the non-sinusoidal signal generation device 700 according to the second embodiment are substantially the same as those for operation modes D1 to D6 in the non-sinusoidal signal generation device 100 according to the first embodiment.

FIGS. 8A to 8E are circuit diagrams illustrating an operation of the non-sinusoidal signal generation device 700 according to the second embodiment.

The output waveform for each section of the non-sinusoidal signal generation device 700 is substantially the same as that in FIG. 4.

Referring to FIGS. 8A to 8E and FIG. 4, FIG. FIGS. 8A to 8E are diagrams illustrating switching states of a circuit with respect to a section D1, a section D2, a section D3, sections D4 to D5, and a section D6, respectively.

Figure 8A:
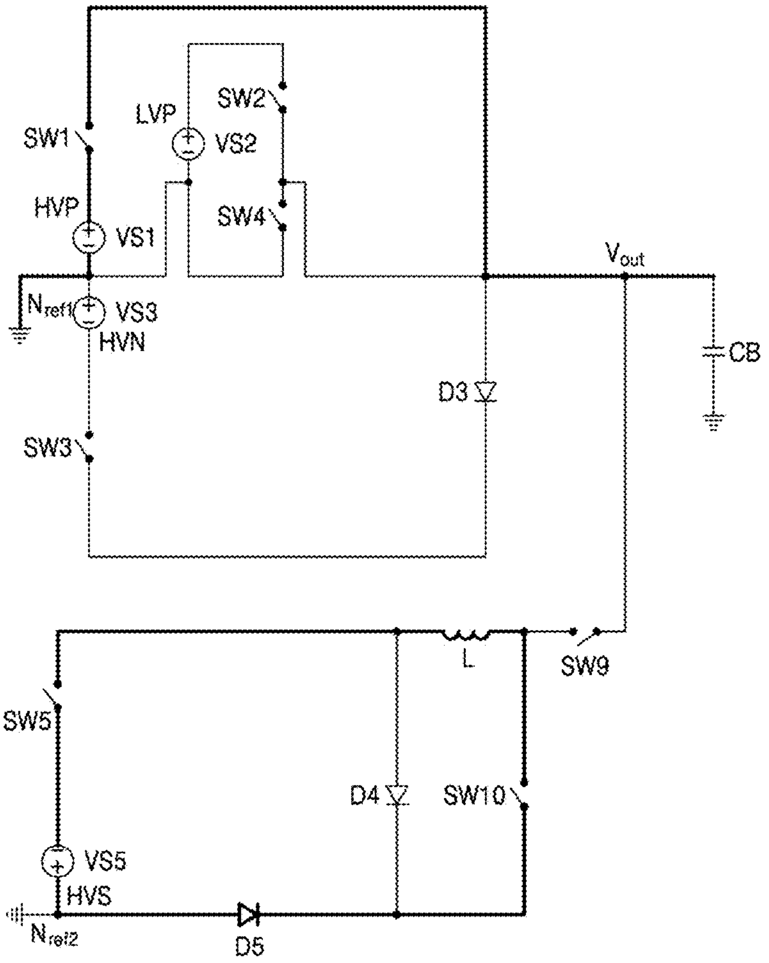
FIGS. 8A to 8E are circuit diagrams illustrating an operation of the non-sinusoidal signal generation device according to the second embodiment.

In FIG. 8A, as the first switch SW1, the fifth switch SW5, and the tenth switch SW10 are in an on state and all the other switches are in an off state, a circuit illustrated by a thick line in FIG. 8A is formed.

In FIG. 8A, the positive terminal of the first voltage source VS1 may be connected to the output terminal Nout via the first switch SW1. Accordingly, the first voltage V1 may be applied as the output voltage Vout.

In addition, as a path including the fifth voltage source VS5, the fifth diode D5, the tenth switch SW10, the inductor L, and the fifth switch SW5 is formed, the inductor L may be charged by the fifth voltage source VS5. At this time, as a closed path passing through the second voltage source VS2 and the third voltage source VS3 is not formed, the second voltage source VS2 and the third voltage source VS3 may be floated.

Figure 8B:
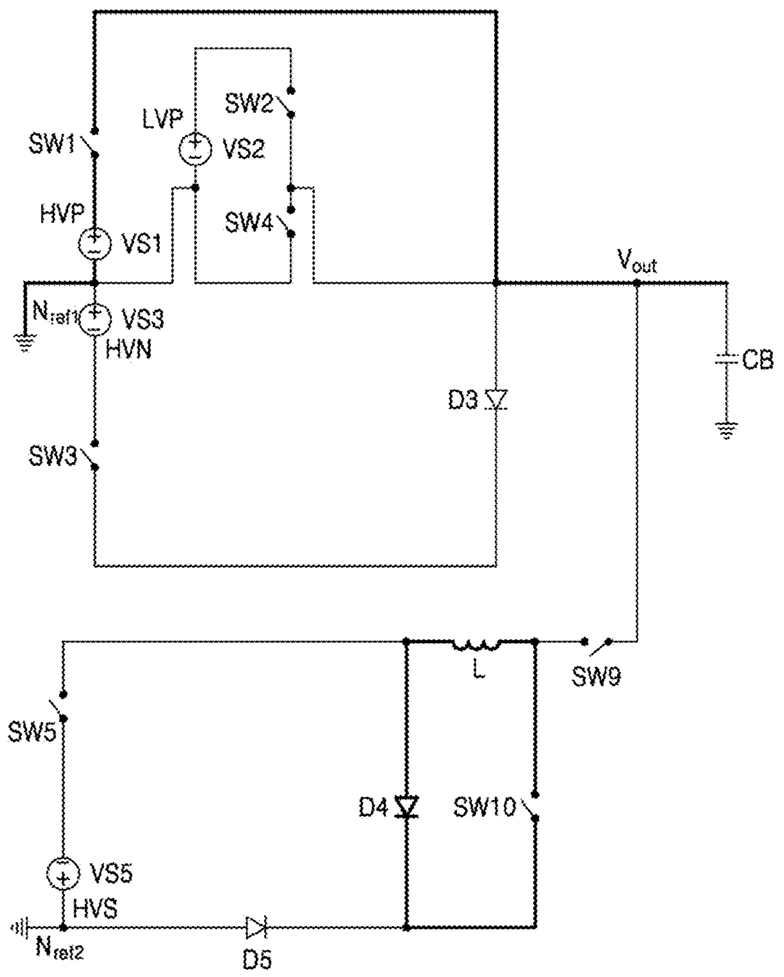

In FIG. 8B, the first switch SW1 and the tenth switch SW10 are in an on state and all the other switches are in an off state, a circuit illustrated by a thick line in FIG. 8B is formed.

In FIG. 8B, the positive terminal of the first voltage source VS1 may be connected to the output terminal Nout via the first switch SW1 and the third diode D3. Accordingly, the first voltage V1 may be applied as the output voltage Vout. In addition, as a closed path composed of the inductor L, the fourth diode D4, and the tenth switch SW10 is formed, the current of the inductor L may flow continuously. At this time, as a closed path passing through the second voltage source VS2, the third voltage source VS3, and the fifth voltage source VS5 is not formed, the second voltage source VS2, the third voltage source VS3, and the fifth voltage source VS5 may be floated.

Figure 8C:
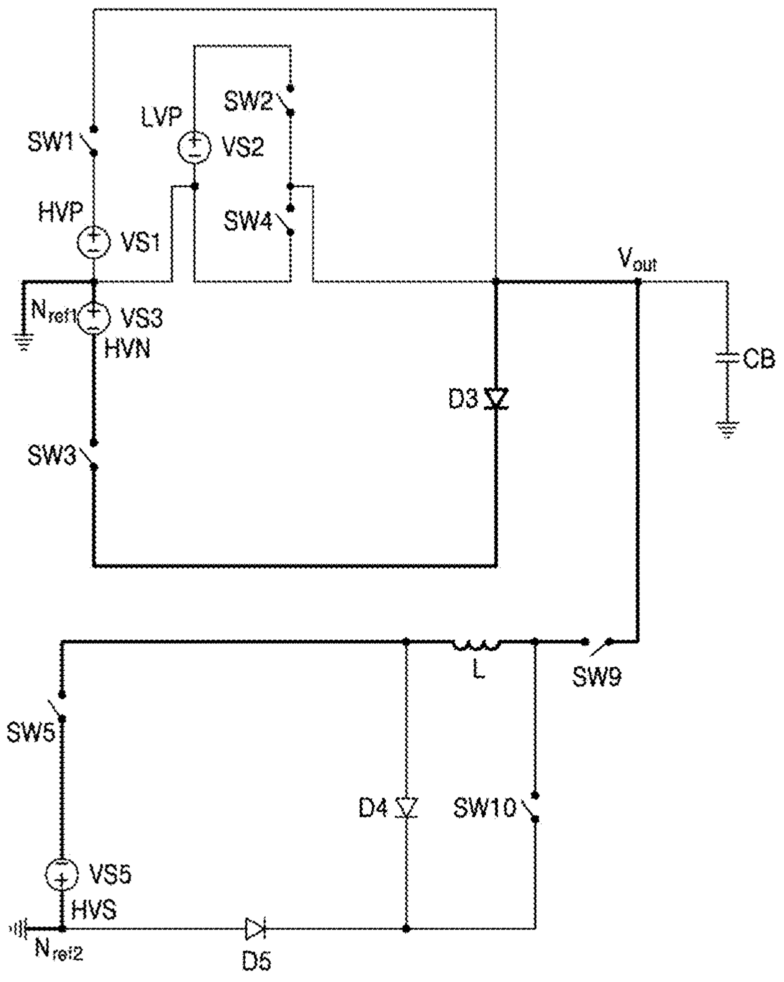

In FIG. 8C, as the third switch SW3, the eighth switch SW8, the fifth switch SW5, and the ninth switch SW9 are in an on state and all the other switches are in an off state, a circuit illustrated by a thick line in FIG. 8C is formed.

In FIG. 8C, the negative terminal of the third voltage source VS3 may be connected to the output terminal Nout via the third and eighth switches SW3 and SW8. Accordingly, the third voltage V3 may be applied as the output voltage Vout. In addition, the negative terminal of the fifth voltage source VS5 is connected to the output terminal Nout via the fifth switch SW5, the inductor L, and the ninth switch SW9. Therefore, the fifth voltage V5 having a negative magnitude and the voltage by the current of the inductor L may be applied to the output terminal Nout. At this time, as a closed path passing through the first voltage source VS1 and the second voltage source VS2 is not formed, the first voltage source VS1 the second voltage source VS2 may be floated.

In FIG. 8C, as a current substantially equal to the current of the inductor L flows into the sawtooth wave circuit 130 from the chamber CB modeled as a capacitive load, a sawtooth wave may be generated. The method for generating the sawtooth wave is substantially the same as the method for generating the sawtooth wave described with reference to FIG. 3C above, including Equations 1 to 7. Thus, further detailed description is omitted.

Figure 8D:
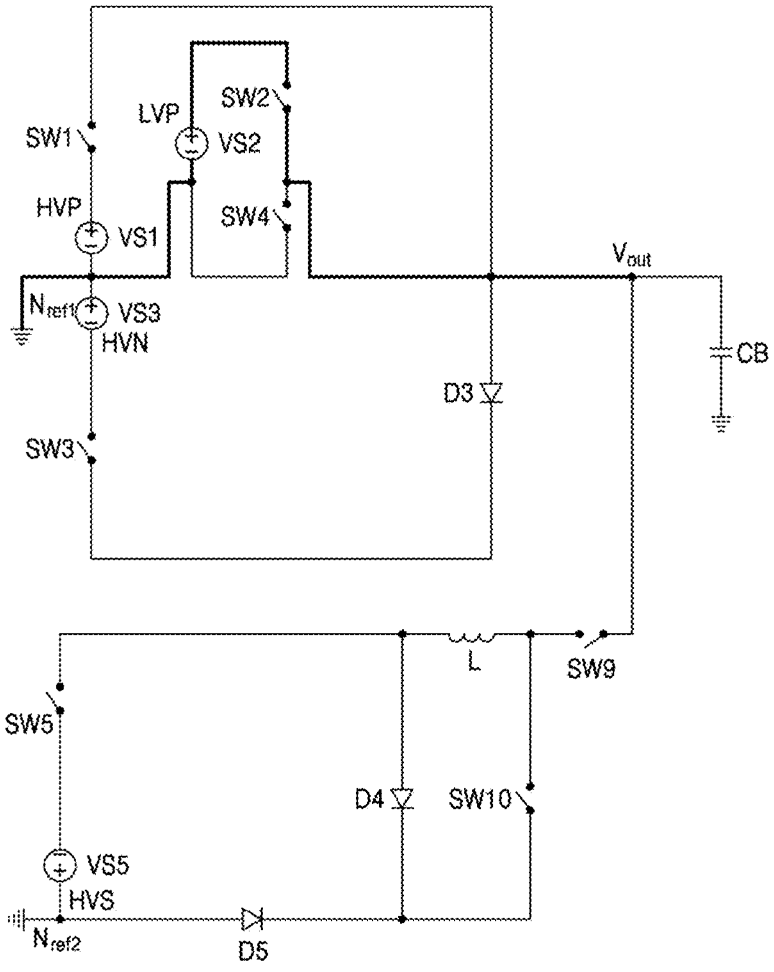

In FIG. 8D, as the second switch SW2 is in an on state and all the other switches are in an off state, a circuit illustrated by a thick line in FIG. 8D is formed.

In FIG. 8D, the positive terminal of the second voltage source VS2 may be connected to the output terminal Nout via the second switch SW2. Accordingly, the second voltage V2 may be applied as the output voltage Vout. At this time, as a closed path passing through the first voltage source VS1, the third voltage source VS3, and the fifth voltage source VS5 is not formed, the first voltage source VS1, the third voltage source VS3, and the fifth voltage source VS5 may be floated.

Figure 8E:
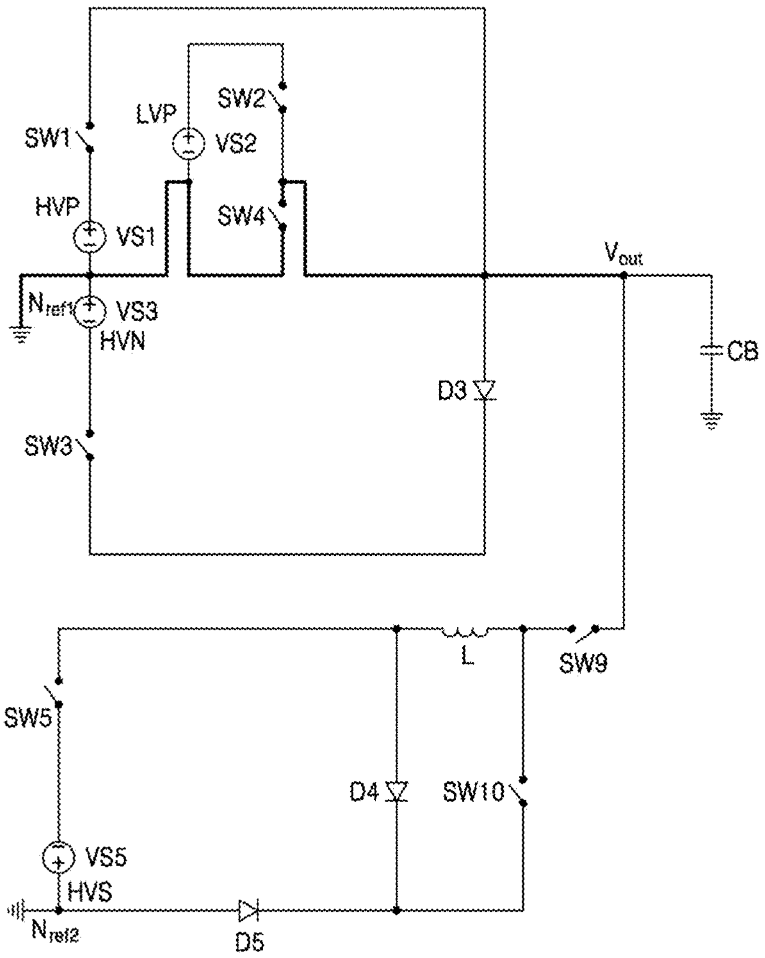

In FIG. 8E, as the fourth switch SW4 is in an on state and all the other switches are in an off state, a circuit illustrated by a thick line in FIG. 8E is formed. Accordingly, a reference potential (e.g., 0 potential) may be provided at the output voltage Vout. At this time, as a closed path passing through the first voltage source VS1, the second voltage source VS2, the third voltage source VS3, and the fifth voltage source VS5 is not formed, the first voltage source VS1, the second voltage source VS2, the third voltage source VS3, and the fifth voltage sources VS5 may be floated.

Figure 9:
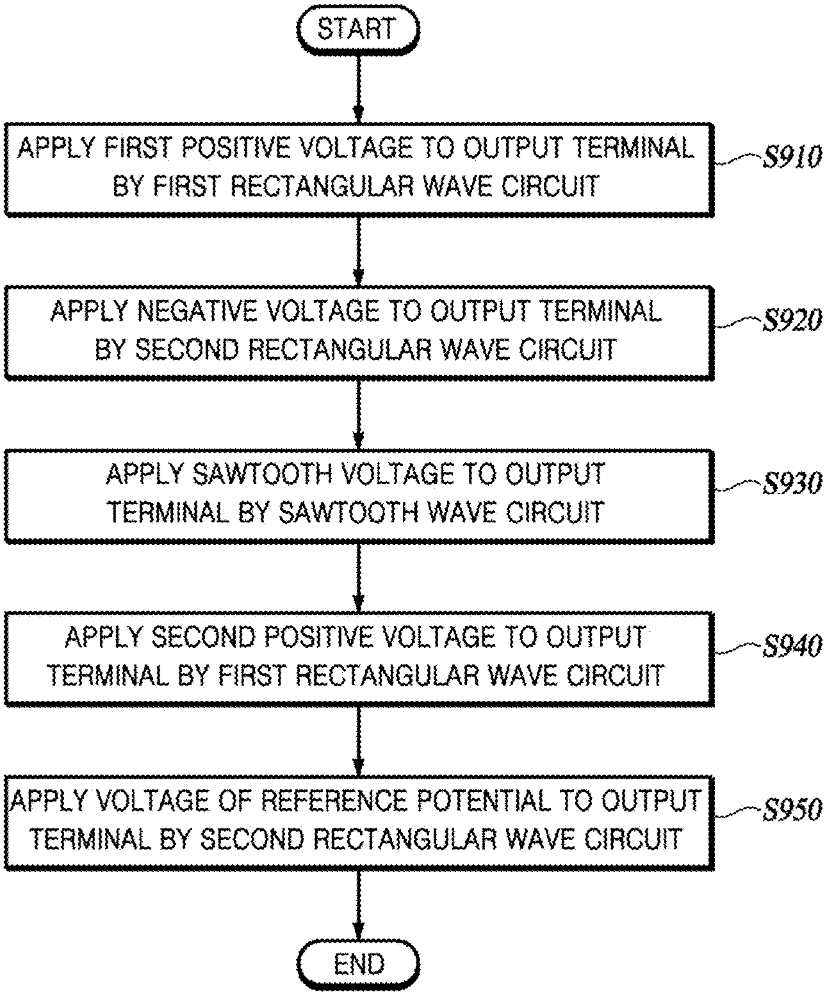
FIG. 9 is a flowchart of a method for generating a non-sinusoidal signal according to the present embodiment.

FIG. 9 is a flowchart of a method for generating a non-sinusoidal signal according to the present embodiment.

A first positive voltage is applied to the output terminal Nout by the first rectangular wave circuit 110 or 710 (S910). The switches in the non-sinusoidal signal generation device 100 or 700 are controlled to be turned on or off to provide the output terminal Nout with the positive voltage V1 of a first magnitude.

A negative voltage is applied to the output terminal Nout by the second rectangular wave circuit 120 or 720 (S920). The switches in the non-sinusoidal signal generation device 100 or 700 are controlled to be turned on or off to provide the output terminal Nout with the negative voltage V3 of the first magnitude.

A sawtooth voltage is applied to the output terminal Nout by the sawtooth wave circuit 130 or 730 (S930). The switches in the non-sinusoidal signal generation device 100 or 700 are controlled to be turned on or off to provide the output terminal Nout with the sawtooth voltage having a maximum magnitude (−V3−).

In step S930, the current is controlled to be drawn from the capacitive load connected to the output terminal Nout by using the inductor L included in the sawtooth wave circuit 130 or 730 in the process of providing the sawtooth voltage.

A second positive voltage is applied to the output terminal Nout by the first rectangular wave circuit 110 or 710 (S940). The switches in the non-sinusoidal signal generation device 100 or 700 are controlled to be turned on or off to provide the output terminal Nout with the positive voltage V2 of a second magnitude.

In the second rectangular wave circuit 120 or 720, a voltage of a reference potential is applied to the output terminal Nout (S950). The switches in the non-sinusoidal signal generation device 100 or 700 are controlled to be turned on or off to provide a reference potential, that is, a voltage of 0, to the output terminal Nout.

Meanwhile, the method for generating the non-sinusoidal signal according to the present embodiment may be similarly performed by the non-sinusoidal signal generation device 700 according to the second embodiment.

The steps S910 to S950 have been described above with reference to the first rectangular wave circuit 110, the second rectangular wave circuit 120, and the sawtooth wave circuit 130 or with reference to the first rectangular wave circuit 710, the second rectangular wave circuit 720, and the sawtooth wave circuit 730. Thus, further detailed descriptions are omitted.

Figure 10:
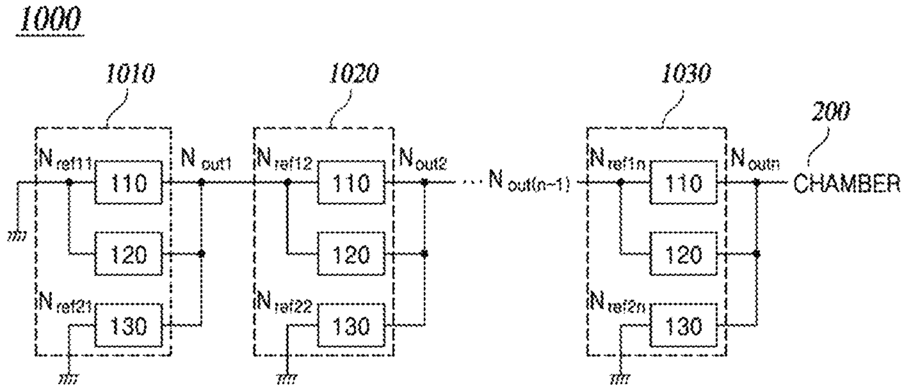
FIG. 10 is a diagram illustrating an example of a non-sinusoidal signal generation device implemented by connecting a plurality of first rectangular wave circuits, a plurality of second rectangular wave circuits, and a plurality of sawtooth wave circuits in series.

FIG. 10 is a diagram illustrating an example of a non-sinusoidal signal generation device implemented by connecting a plurality of first rectangular wave circuits, a plurality of second rectangular wave circuits, and a plurality of sawtooth wave circuits in series.

As shown in FIG. 10, n unit circuits (i.e., the first circuit 1010, the second circuit 1020, . . . , and the $n^{th}$ circuit 1030) may be connected in series to implement the non-sinusoidal signal generation device 1000. For reference, a controller (not shown) is omitted in FIG. 10.

The n unit circuits 1010, 1020, and 1030 each include a first rectangular wave circuit 110, a second rectangular wave circuit 120, and a sawtooth wave circuit 130, and the n unit circuits are connected as shown in FIG. 10 so that the $n^{th}$ circuit 1030 at the end outputs a non-sinusoidal signal to the chamber 200.

In the first circuit 1010, a first reference terminal Nef11 and a second reference terminal Nef21 are connected to the ground. In the second circuit 1020, a first reference terminal Nef12 is connected to an output terminal Nout1 of the first circuit 1010 and a second reference terminal Nef22 is connected to the ground. In the $n^{th}$ circuit 1030, a first reference terminal Nref1*n* is connected to an output terminal Nout(n−1) of the $(n-1)^{th}$ circuit (not shown), a second reference terminal Nref2*n* is connected to the ground, and an output terminal Noutn is connected to the chamber 200.

Figure 11:
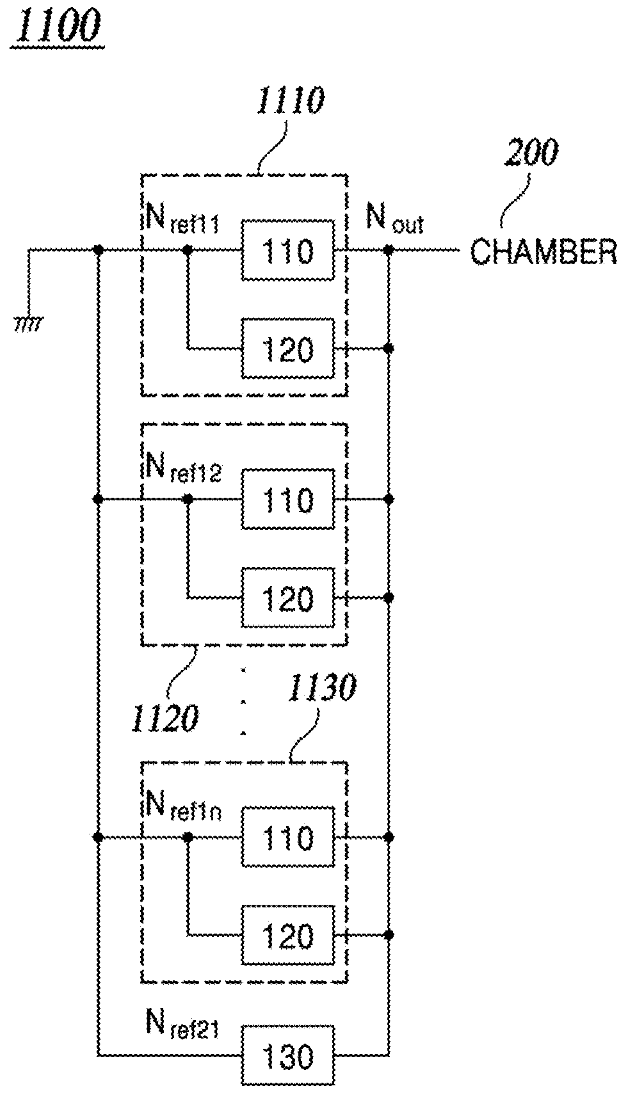
FIG. 11 is a diagram illustrating an example of a non-sinusoidal signal generation device implemented by connecting a plurality of first rectangular wave circuits, a plurality of second rectangular wave circuits, and one sawtooth wave circuit in parallel.

FIG. 11 is a diagram illustrating an example of a non-sinusoidal signal generation device implemented by connecting a plurality of first rectangular wave circuits, a plurality of second rectangular wave circuits, and one sawtooth wave circuit in parallel.

As shown in FIG. 11, n unit circuits (i.e., the first circuit 1110, the second circuit 1120, . . . , and the $n^{th}$ circuit 1130) and the sawtooth wave circuit 130 are connected in parallel to implement a non-sinusoidal signal generation device 1100. For reference, a controller (not shown) is omitted in FIG. 11.

The n unit circuits 1110, 1120, and 1130 each include a first rectangular wave circuit 110 and a second rectangular wave circuit 120.

Each of the first reference terminals Nref11, Nref12, . . . , and Nref1*n* of the first to $n^{th}$ unit circuits 1110, 1120, and 1130 and the second reference terminal Nref2 of the second rectangular wave circuit 120 is connected to the ground. The first to $n^{th}$ unit circuits 1110, 1120, and 1130 and the second rectangular wave circuit 120 are each connected to the output terminal as shown in FIG. 2 to output the non-sinusoidal signal to the chamber 200.

Figure 12:
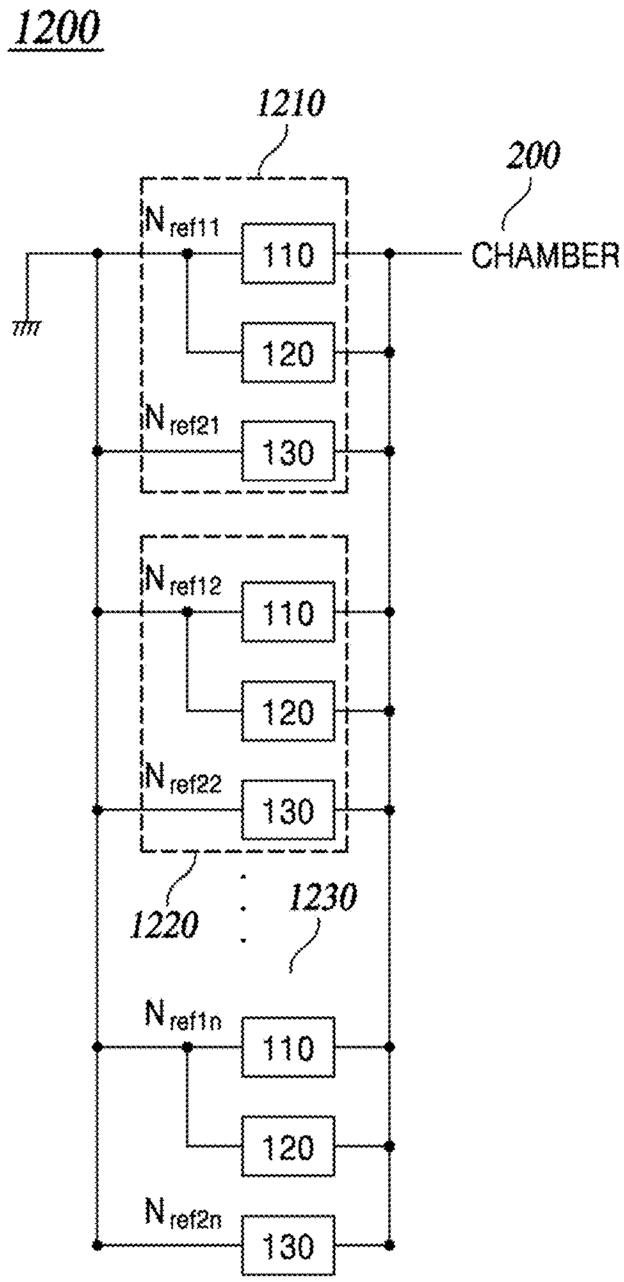
FIG. 12 is a diagram illustrating an example of a non-sinusoidal signal generation device implemented by connecting a plurality of first rectangular wave circuits, a plurality of second rectangular wave circuits, and a plurality of sawtooth wave circuits in parallel.

FIG. 12 is a diagram illustrating an example of a non-sinusoidal signal generation device implemented by connecting a plurality of first rectangular wave circuits, a plurality of second rectangular wave circuits, and a plurality of sawtooth wave circuits in parallel.

As shown in FIG. 12, n unit circuits (i.e., the first circuit 1210, the second circuit 1220, . . . , and the $n^{th}$ circuit 1230) may be connected in parallel to implement a non-sinusoidal signal generation device 1200. For reference, a controller (not shown) is omitted in FIG. 12.

The n unit circuits 1210, 1220, and 1230 each include a first rectangular wave circuit 110, a second rectangular wave circuit 120, and a sawtooth wave circuit 130.

In the first to $n^{th}$ unit circuits 1210, 1220, and 1230, each of the first reference terminals Nref11, Nref12, . . . , and Nref1*n* and each of the second reference terminals Nref21, Nref22, . . . , and Nref2*n* are connected to the ground and are connected to the output terminal, as shown in FIG. 2, to output a non-sinusoidal signal to the chamber 200.

In FIGS. 10 to 12, instead of the first rectangular wave circuit 110, the second rectangular wave circuit 120, and the sawtooth wave circuit 130, the first rectangular wave circuit 710, the second rectangular wave circuit 720, and the sawtooth wave circuit 730 may be used, respectively.

Figure 13A:
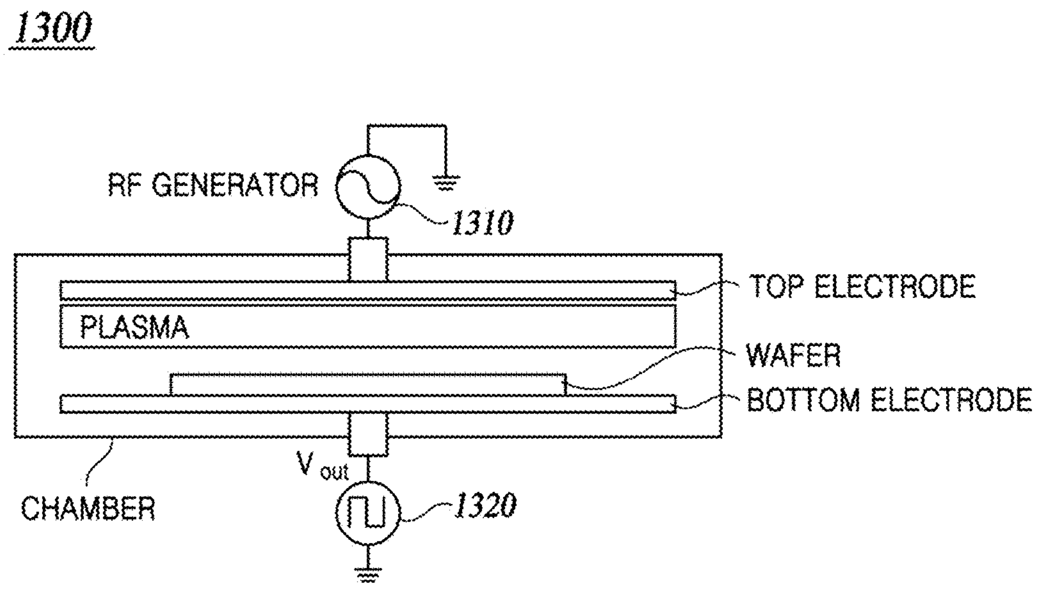
FIGS. 13A and 13B are block diagrams of an apparatus 1400 for manufacturing a semiconductor device according to the present embodiment.
Figure 13B:
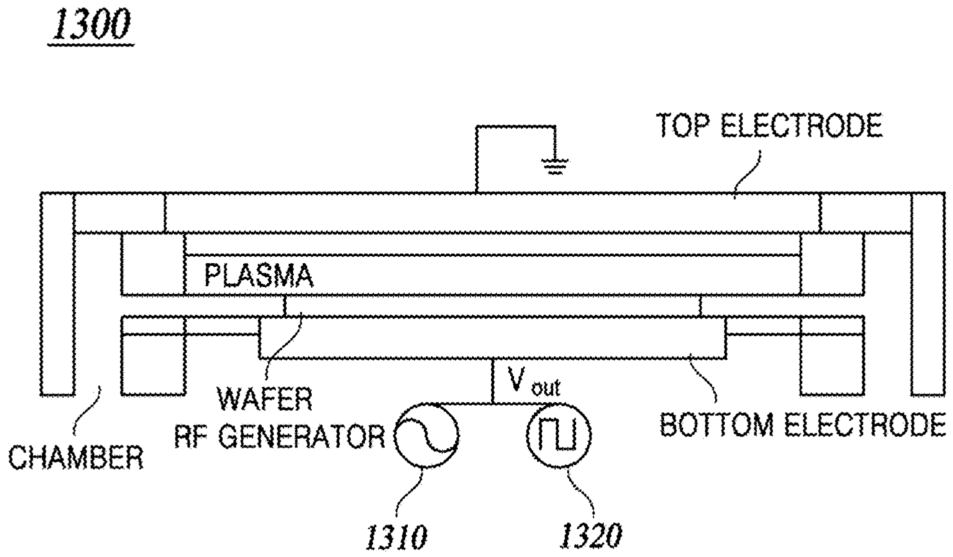

FIGS. 13A and 13B are block diagrams of an apparatus for manufacturing a semiconductor device 1300 according to the present embodiment.

Referring to FIG. 13A, the apparatus for manufacturing a semiconductor device 1300 may include a chamber CB, a first power generator 1310, and a second power generator 1320.

A top electrode TE may be arranged in an upper region of the chamber CB, a bottom electrode BE may be arranged in a lower region of the chamber CB, and a wafer W may be disposed on the bottom electrode BE.

The bottom electrode BE may be an electrostatic chuck (ESC) that adsorbs and supports the wafer W by using electrostatic force. In addition, the chamber CB may include a gas supply unit and a gas discharge unit, wherein the gas supply unit may supply a reaction gas into the chamber CB and the gas discharge unit may discharge the gas to maintain the chamber CB in a vacuum state.

The first power generator 1310 may generate a first power and may provide the generated first power to the top electrode TE. The first power, which is a power for generating plasma, may be referred to as a source power. The first power generator 1310 may be a device for generating a high-frequency power source in the form of a sinusoidal wave of several tens of MHz.

The second power generator 1320 may generate a second power in a non-sinusoidal form. The second power, which is a power for controlling ion energy of the plasma, may be referred to as a bias power.

When the second power is provided to the bottom electrode BE, a voltage may be induced to the wafer W disposed on the bottom electrode BE. Accordingly, the voltage of the wafer W may be controlled according to the second power. Thus, the ion energy of the plasma generated in the chamber CB may be controlled.

In the present embodiment, the second power generator 1320 may generate any waveform of high voltage and high speed set by a user. For example, the second power generator 1320 may generate a voltage having a certain waveform having a voltage level of several tens of V to several tens of kV at a frequency of several kHz to several MHz. The second power generator 1320 may be implemented by using the non-sinusoidal signal generation devices 100, 200, 700, 1000, 1100, and 1200 in FIG. 1, FIG. 2, FIG. 7, FIG. 10, FIG. 11, and FIG. 12, and the descriptions above with reference to FIG. 1 to FIG. 12 may be applied to the second power generator 1320.

Specifically, the second power generator 1320 may include at least one first rectangular wave circuit, at least one second rectangular wave circuit, and at least one slope circuit, wherein the at least one first rectangular wave circuit, the at least one second rectangular wave circuit, and the least one slope circuit may be connected by any one method shown in FIG. 1, FIG. 2, FIG. 7, FIG. 10, FIG. 11, and FIG. 12.

As shown in FIG. 1 and FIGS. 10 to 12, the second power generator 1420 may include a plurality of first rectangular wave circuits, a plurality of second rectangular wave circuits, and a plurality of slope circuits.

The magnitude distribution of the ion energy generated by the second power generator 1310 may be determined based on the number of first rectangular wave circuits, the number of second rectangular wave circuits, and the number of sawtooth wave circuits. Therefore, the number of first rectangular wave circuits and second rectangular wave circuits to be activated among the plurality of first rectangular wave circuits and the plurality of second rectangular wave circuits, and the number of sawtooth wave circuits to be activated among the plurality of sawtooth wave circuits may be determined according to the target magnitude of the magnitude distribution of the ion energy.

In addition, the distribution of ion energy may be determined according to a waveform of the sawtooth voltage output from the sawtooth wave circuit. Accordingly, the switch driving signals generated from the controller (e.g., the controller 140 of FIG. 1) in the second power generator 1320 may be controlled, according to the target distribution of ion energy. For example, the second power generator 1320 may control the switch to output a waveform of the sawtooth voltage such that plasma ions are distributed over a narrow energy region.

On the other hand, unlike in FIG. 13A, the apparatus for manufacturing a semiconductor device 1300 may be implemented to provide the first power generated by the first power generator 1310 to the bottom electrode BE as shown in FIG. 13B.

In FIGS. 13A and 13B, the apparatus for manufacturing a semiconductor device 1300 may further include a filter between the second power generator 1320 and the bottom electrode BE. The filter may cut off the first power so that the first power generated by the first power generator 1310 is not applied to the second power generator 1320 and may pass the second power so that the second power generated by the second power generator 1320 is applied to the bottom electrode BE. Specifically, the filter may remove the frequency component of the RF power generated from the first power generator 1310. For example, the filter may be configured as a low pass filter, a band stop filter, or a combination of the low pass filter and the band stop filter.

In addition, in FIG. 13A, the apparatus for manufacturing a semiconductor device 1300 may further include a filter between the first power generator 1310 and the top electrode TE. The filter may cut off the second power so that the second power generated by the second power generator 1320 is not applied to the first power generator 1310 and may pass the first power so that the first power generated by the first power generator 1310 is applied to the top electrode TE.

In addition, in FIG. 13B, the apparatus for manufacturing a semiconductor device 1300 may further include a filter between the first power generator 1310 and the bottom electrode BE. The filter may cut off the second power so that the second power generated by the second power generator 1320 is not applied to the first power generator 1310 and may pass the first power so that the first power generated by the first power generator 1310 is applied to the bottom electrode BE.

The filter may be configured as a low pass filter, a band stop filter, or a combination of the low pass filter and the band stop filter.

The reaction gas may be diffused into the chamber CB and converted into plasma by the first power applied through the top electrode TE or the bottom electrode BE and the second power applied through the bottom electrode BE. The plasma is brought into contact with the surface of the wafer W to physically or chemically react. Through this reaction, a wafer processing process, such as plasma annealing, etching, plasma-enhanced chemical vapor deposition, physical vapor deposition, and plasma cleaning, may be performed.

When the apparatus for manufacturing a semiconductor device 1300 is used in an etching process, the reaction gas is plasma-formed by high-frequency discharge between the bottom electrode BE and the top electrode TE. A film to be processed on the wafer W may be etched in a desired pattern by radicals, electrons, and ions activated by the plasma. According to the present embodiment, by precisely controlling the radicals, electrons, and ions of plasma, the etching performance, such as an etching rate, an aspect ratio, a critical dimension of an etching pattern, a profile of the etching pattern, and a selectivity, may be improved.

On the other hand, various functions or methods described herein may be implemented with instructions stored in a non-transitory recording medium, which can be read and executed by one or more processors. The non-transitory recording medium includes all types of recording devices for storing data, e.g., in a readable form by a computer system. For example, the non-transitory recording medium includes a storage medium, such as erasable programmable read-only memory (EPROM), a flash drive, an optical drive, a magnetic hard drive, and a solid-state drive (SSD).

It should be understood that the example embodiments described above may be implemented in many different ways. The functions described in one or more examples may be implemented in hardware, software, firmware, or any combination thereof. It should be understood that the functional components described herein have been labeled "unit" to particularly emphasize their implementation independence.

The above description is merely illustrative of the technical idea of the present embodiment, and various modifications and variations are possible to those skilled in the art without departing from the essential characteristics of the present embodiment. Therefore, the present embodiments are not intended to limit but to explain the technical idea of the present embodiment, and the scope of the technical idea of the present embodiment is not limited by the present embodiment. The protection scope of the present embodiment should be interpreted by the following claims, and all technical ideas falling within the scope equivalent thereto should be interpreted as being included in the scope of rights of the present embodiment.

What is claimed is:

1. A non-sinusoidal signal generation device comprising:

a first rectangular wave circuit configured to be able to apply positive voltages of two different magnitudes to an output terminal;

a second rectangular wave circuit configured to be able to apply one negative voltage to the output terminal; and a sawtooth wave circuit configured to be able to apply one sawtooth voltage to the output terminal, wherein the sawtooth wave circuit comprises an inductor configured to draw current from a capacitive load connected to the output terminal, wherein the first rectangular wave circuit comprises a first voltage source circuit and a second voltage source circuit connected in parallel, each of which generates positive voltages of two different magnitudes by connecting a negative terminal to a reference terminal, wherein the first voltage source circuit comprises a first voltage source and a first switch connected in series, and the second voltage source circuit comprises a second voltage source and a second switch connected in series, wherein the second rectangular wave circuit comprises a third voltage source circuit having a positive terminal connected to reference terminal, wherein the third voltage source circuit comprises a third switch and a third voltage source connected in series, and a fourth switch is connected in parallel with the second voltage source circuit.

2. The non-sinusoidal signal generation device of claim 1, wherein, in the first rectangular wave circuit, a seventh switch is connected between a positive terminal of the first voltage source circuit and the output terminal, and in the second rectangular wave circuit, the eighth switch is connected between a negative terminal of the third voltage source circuit and the output terminal.

3. The non-sinusoidal signal generation device of claim 2, wherein the first rectangular wave circuit further comprises a first diode having a cathode connected to a positive terminal of the first voltage source circuit and an anode connected to a negative terminal of the second voltage source circuit.

4. The non-sinusoidal signal generation device of claim 2, wherein the second rectangular wave circuit further comprises a second diode having a cathode connected to a positive terminal of the second voltage source circuit and an anode connected to a negative terminal of the third voltage source circuit.

5. The non-sinusoidal signal generation device of claim 2, further comprising a third diode connected between the eighth switch and the output terminal.

6. The non-sinusoidal signal generation device of claim 1, wherein the sawtooth wave circuit is connected to a fifth voltage source circuit which generates a negative voltage by connecting a reference terminal to a positive terminal, wherein the fifth voltage source circuit comprises a fifth voltage source and a fifth switch connected in series, wherein a negative terminal of the fifth voltage source circuit is connected in parallel to an anode of a fourth diode and one end of an inductor, a tenth switch is connected between the other end of the inductor and a cathode of the fourth diode, a fifth diode is connected between the reference terminal and the cathode of the fourth diode, and a ninth switch is connected between the other end of the inductor and the output terminal.

7. The non-sinusoidal signal generation device of claim 6, wherein, in the sawtooth wave circuit, the fifth voltage source is connected to a circuit by the fifth switch, a current flows from the fifth voltage source to the inductor, and a capacitive load connected to the output terminal is discharged by using the current flowing to the inductor to apply the sawtooth voltage to the output terminal.

8. A method for generating a non-sinusoidal signal by a device including a first rectangular wave circuit, a second rectangular wave circuit, and a sawtooth wave circuit, the method comprising:

applying a first positive voltage to an output terminal by the first rectangular wave circuit;

applying a negative voltage to the output terminal by the second rectangular wave circuit;

applying a first sawtooth voltage to the output terminal by the sawtooth wave circuit; and applying a second positive voltage to the output terminal by the first rectangular wave circuit, wherein, when applying the first sawtooth voltage, current is drawn from a capacitive load connected to the output terminal by using an inductor included in the sawtooth wave circuit, wherein the first rectangular wave circuit comprises a first voltage source circuit and a second voltage source circuit connected in parallel, each of which generates positive voltages of two different magnitudes by connecting a negative terminal to a reference terminal, wherein the first voltage source circuit comprises a first voltage source and a first switch connected in series, and the second voltage source circuit comprises a second voltage source and a second switch connected in series, wherein the second rectangular wave circuit comprises a third voltage source circuit having a positive terminal connected to reference terminal, wherein the third voltage source circuit comprises a third switch and a third voltage source connected in series, and a fourth switch is connected in parallel with the second voltage source circuit.

9. An apparatus for manufacturing a semiconductor device comprising a non-sinusoidal signal generation device and a chamber, wherein the non-sinusoidal signal generation device comprises:

a first rectangular wave circuit configured to be able to apply positive voltages of two different magnitudes to an output terminal;

a second rectangular wave circuit configured to be able to apply negative voltages of two different magnitudes to the output terminal; and a sawtooth wave circuit configured to be able to apply sawtooth voltages of two different magnitudes to the output terminal, wherein the sawtooth wave circuit comprises an inductor configured to draw current from a capacitive load connected to the output terminal, wherein the first rectangular wave circuit comprises a first voltage source circuit and a second voltage source circuit connected in parallel, each of which generates positive voltages of two different magnitudes by connecting a negative terminal to a reference terminal, wherein the first voltage source circuit comprises a first voltage source and a first switch connected in series, and the second voltage source circuit comprises a second voltage source and a second switch connected in series, wherein the second rectangular wave circuit comprises a third voltage source circuit having a positive terminal connected to reference terminal, wherein the third voltage source circuit comprises a third switch and a third voltage source connected in series, and a fourth switch is connected in parallel with the second voltage source circuit.

* * * * *